US007268981B2

(12) United States Patent
Heim

(10) Patent No.: US 7,268,981 B2
(45) Date of Patent: Sep. 11, 2007

(54) SPIN VALVE SENSOR HAVING ANTIFERROMAGNETIC (AFM) PINNING LAYER STRUCTURES FORMED IN THE END REGIONS

(75) Inventor: David Eugene Heim, Redwood City, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 410 days.

(21) Appl. No.: 10/837,168

(22) Filed: Apr. 30, 2004

(65) Prior Publication Data

US 2005/0243475 A1  Nov. 3, 2005

(51) Int. Cl.
G11B 5/39 (2006.01)
G11B 5/33 (2006.01)

(52) U.S. Cl. .............................. 360/324.11; 360/324.1; 360/324.12

(58) Field of Classification Search ............. 360/324.1, 360/324.2, 324.11, 324.12
See application file for complete search history.

(56) References Cited

U.S. PATENT DOCUMENTS

| 5,657,191 | A | 8/1997 | Yuan |
| 5,661,621 | A | 8/1997 | Kbayashi et al. |
| 5,805,389 | A | 9/1998 | Saito et al. |
| 5,905,611 | A | 5/1999 | Yoda et al. |
| 5,933,297 | A | 8/1999 | Hoshiya et al. |
| 6,064,552 | A | 5/2000 | Iwasaki et al. |
| 6,134,091 | A | 10/2000 | Toki et al. |
| 6,201,465 | B1 | 3/2001 | Saito et al. |
| 6,266,218 | B1 | 7/2001 | Carey et al. |
| 6,385,017 | B1 | 5/2002 | Min et al. |
| 6,396,668 | B1 | 5/2002 | Mao et al. |
| 6,445,554 | B1 | 9/2002 | Dong et al. |
| 6,469,879 | B1 | 10/2002 | Redon et al. |
| 6,704,176 | B2 | 3/2004 | Shukh et al. |
| 6,865,062 | B2* | 3/2005 | Pinarbasi ............... 360/324.11 |
| 6,943,997 | B2* | 9/2005 | Gill ....................... 360/324.12 |
| 7,035,059 | B2* | 4/2006 | Gill ....................... 360/324.11 |
| 2002/0101691 | A1 | 8/2002 | Zhu |
| 2002/0101693 | A1 | 8/2002 | Hashimoto et al. |
| 2002/0114111 | A1 | 8/2002 | Zhu |

(Continued)

FOREIGN PATENT DOCUMENTS

JP    6103537    4/1994

(Continued)

Primary Examiner—William J Klimowicz
(74) Attorney, Agent, or Firm—John J. Oskorep, Esq.; Matthew Zisee

(57) ABSTRACT

In one illustrative example, a spin valve sensor includes a free layer structure; an anti-parallel (AP) pinned layer structure which includes at least a first AP pinned layer; and a non-magnetic electrically conductive spacer layer formed between the free layer structure and the AP pinned layer structure. First and second antiferromagnetic (AFM) pinning layer structures for magnetically pinning the first AP pinned layer are formed in end regions but are absent from its central region. Edges of each AFM pinning layer structure may be separated by a distance $D_A$ from the sensor edges. The first AP pinned layer is formed in both the central region and the end regions so as to be in contact with the first and second AFM pinning layer structures. Advantageously, adequate pinning properties are exhibited in a sensor which provides the benefits of a self-pinned sensor (e.g. a reduced sensor profile in the central region).

16 Claims, 13 Drawing Sheets

U.S. PATENT DOCUMENTS

| | | |
|---|---|---|
| 2004/0027731 A1 | 2/2004 | Hasegawa et al. |
| 2004/0067389 A1* | 4/2004 | Hasegawa et al. .......... 428/692 |
| 2005/0013061 A1* | 1/2005 | Gill ....................... 360/324.11 |
| 2005/0052792 A1* | 3/2005 | Gill ....................... 360/324.12 |

FOREIGN PATENT DOCUMENTS

| | | |
|---|---|---|
| JP | 2000163717 | 6/2000 |
| JP | 2001034918 | 2/2001 |

* cited by examiner

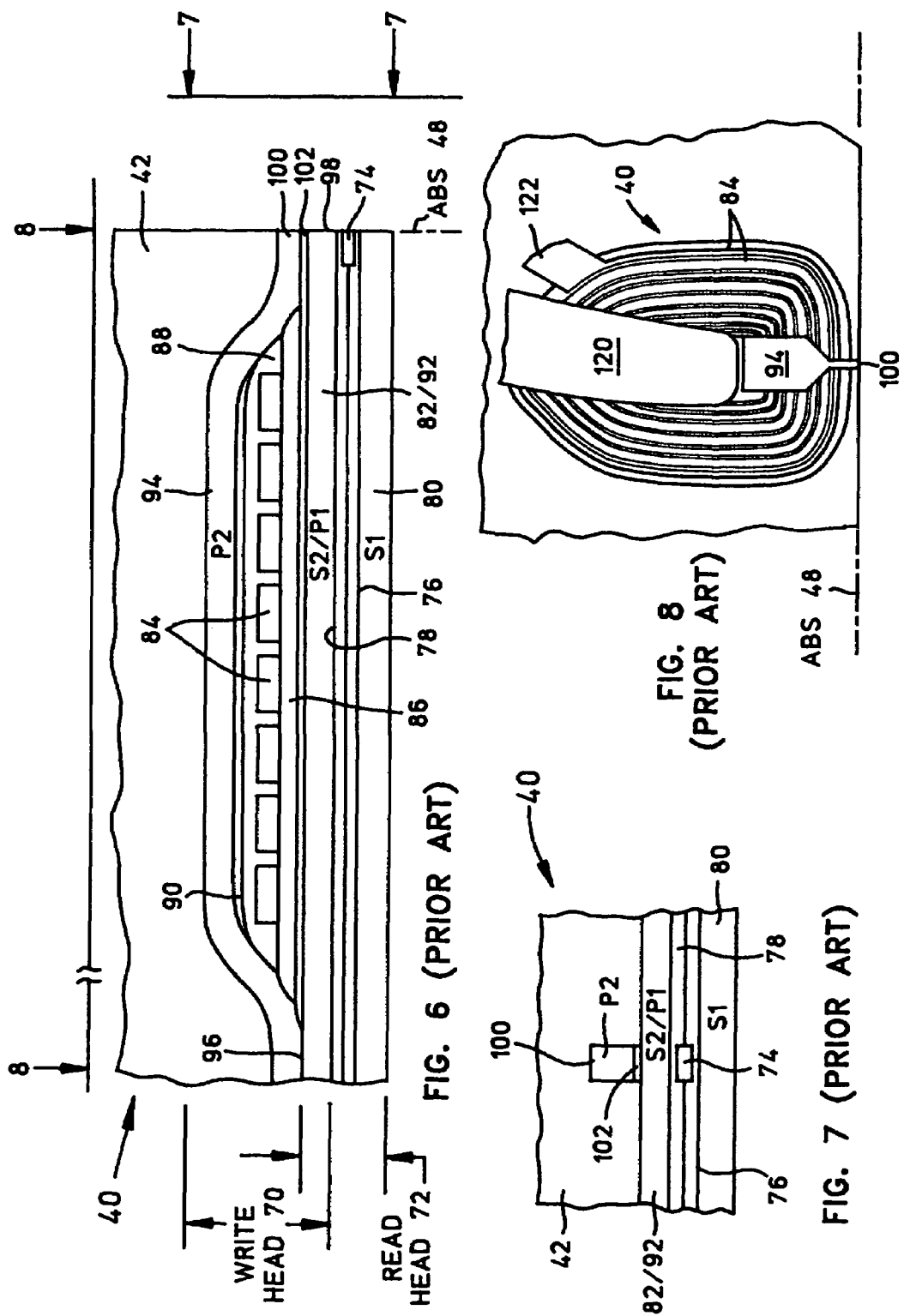

(ABS)

SPIN VALVE SENSOR HAVING ANTIFERROMAGNETIC (AFM) PINNING LAYER STRUCTURES FORMED IN THE END REGIONS

BACKGROUND OF THE INVENTION

1. Field of the Invention

The present invention relates generally to spin valve sensors, and more particularly to a spin valve sensor having a pinned layer which is longitudinally biased by antiferromagnetic (AFM) pinning layers in end regions outside the central active sensor region.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which the MR element resistance varies as the square of the cosine of the angle between the magnetization of the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Within the general category of MR sensors is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron, cobalt-iron, or nickel-iron-cobalt) separated by a layer of nonmagnetic material (e.g., copper) are generally referred to as spin valve (SV) sensors manifesting the SV effect.

In an SV sensor, one of the ferromagnetic layers, referred to as the pinned layer, has its magnetization typically pinned by exchange coupling with an antiferromagnetic (AFM) layer (e.g., nickel-oxide, iron-manganese, or platinum-manganese) layer. The pinning field generated by the AFM layer should be greater than demagnetizing fields to ensure that the magnetization direction of the pinned layer remains fixed during application of external fields (e.g. fields from bits recorded on the disk). The magnetization of the other ferromagnetic layer, referred to as the free layer, however, is not fixed and is free to rotate in response to the field from the information recorded on the magnetic medium (the signal field). The pinned layer may be part of an antiparallel (AP) pinned layer structure which includes an antiparallel coupling (APC) layer formed between first and second AP pinned layers. The first AP pinned layer, for example, may be the layer that is exchange coupled to and pinned by the AFM pinning layer. By strong antiparallel coupling between the first and second AP pinned layers, the magnetic moment of the second AP pinned layer is made antiparallel to the magnetic moment of the first AP pinned layer.

In a self-pinned spin valve sensor, however, the first AP pinned layer is not pinned by the AFM layer but is rather "self-pinned". A spin valve sensor of this type relies on magnetostriction of the AP self-pinned layer structure and the air bearing surface (ABS) stress for a self-pinning effect. An AFM pinning layer, which is typically as thick as 150 Angstroms, is no longer necessary for pinning so that a relatively thin sensor can be advantageously fabricated.

Utilizing a self-pinned structure in a spin valve sensor achieves higher bit densities with its thinner profile and increased sensitivity. One of the problems for self-pinned spin valves, however, has been to improve the pinning field against "flipping". Readback signals from the disk are detected as either a "0" or "1" depending on the polarity of the bits recorded on the disk. However, when an undesirable head-to-disk interaction occurs (due to defects, asperities, bumps, etc.), the sensor experiences compressive or tensile stress which causes the pinned layers to flip orientation. Electrical overstress (EOS) from electrostatic discharge (ESD) in the sensor during manufacturing and/or handling may also induce such flipping. The pinned layers may flip their direction either permanently or semi-permanently depending on the severity of the stress. This causes the amplitude of the readback signal to flip (hence the terminology "amplitude flip"), which results in corrupt data. While the self-pinned structural approach decreases the occurrence and severity of amplitude flipping amongst self-pinned spin valve heads, an unacceptably large fraction still exhibit amplitude flipping into the negative polarity state.

Accordingly, there is an existing need to overcome these and other deficiencies of the prior art.

SUMMARY

In one illustrative example of the present invention, a spin valve sensor includes a free layer structure; an anti-parallel (AP) pinned layer structure which includes at least a first AP pinned layer; and a non-magnetic electrically conductive spacer layer formed between the free layer structure and the AP pinned layer structure. First and second antiferromagnetic (AFM) pinning layer structures for magnetically pinning the first AP pinned layer are formed in end regions of the sensor but are absent from a central region of the sensor. The first AP pinned layer is formed in both the central region and the end regions so as to be in contact with the first and second AFM pinning layer structures in the end regions. Advantageously, adequate pinning properties are exhibited in a sensor which provides the benefits of a self-pinned sensor (i.e. a reduced sensor profile in the central region).

BRIEF DESCRIPTION OF THE DRAWINGS

For a fuller understanding of the nature and advantages of the present invention, as well as the preferred mode of use, reference should be made to the following detailed description read in conjunction with the accompanying drawings:

FIG. 6 is a partial view of the slider and a merged magnetic head as seen in plane 6-6 of FIG. 2;

FIG. 7 is a partial ABS view of the slider taken along plane 7-7 of FIG. 6 to show the read and write elements of the merged magnetic head;

FIG. 8 is a view taken along plane 8-8 of FIG. 6 with all material above the coil layer and leads removed;

DETAILED DESCRIPTION OF THE PREFERRED EMBODIMENTS

In one illustrative embodiment of the present invention, a spin valve sensor includes a free layer structure; an anti-parallel (AP) pinned layer structure which includes at least a first AP pinned layer; and a non-magnetic electrically conductive spacer layer formed between the free layer structure and the AP pinned layer structure. First and second antiferromagnetic (AFM) pinning layer structures for magnetically pinning the first AP pinned layer are formed in end regions of the sensor but are absent from a central region of the sensor. The first AP pinned layer is formed in the central region and the end regions so as to be in contact with the first and second AFM pinning layer structures. Advantageously, adequate pinning properties are exhibited in a sensor which provides the benefits of a self-pinned sensor (i.e. a reduced sensor profile in the central region). The spin valve sensor may be a "bottom-type" sensor (whether or not a "lead-overlay" design) where portions of the first AP pinned layer are formed over and in contact with the first and second AFM pinning layer structures in the end regions. On the other hand, the spin valve sensor may be a "top-type" sensor where portions of the first AP pinned layer are formed underneath and in contact with the first and second AFM pinning layer structures in the end regions.

The following description represents several embodiments presently contemplated for carrying out the present invention. This description is made for the purpose of illustrating the general principles of the present invention and is not meant to limit the inventive concepts claimed herein.

Figure 1:
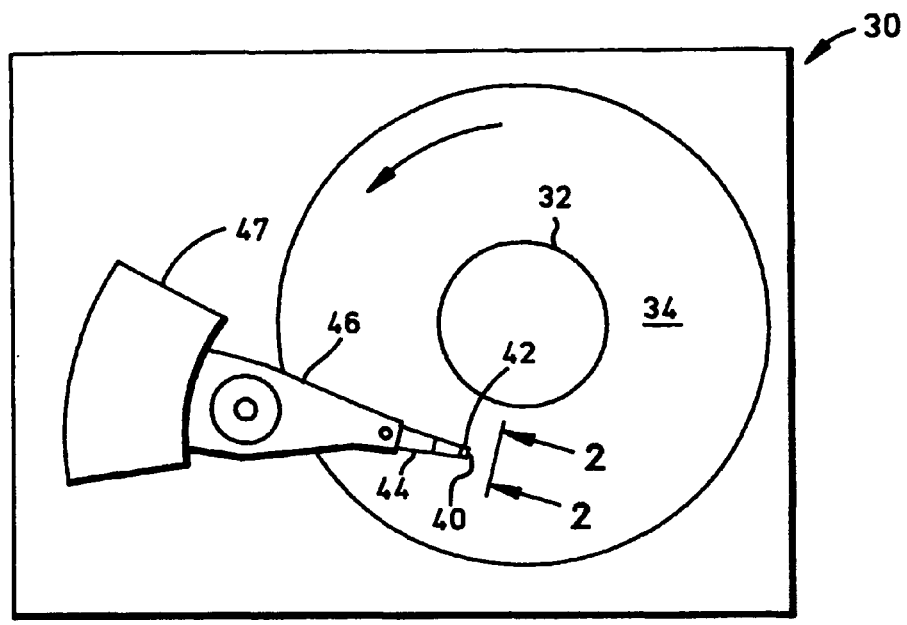
FIG. 1 is a plan view of an exemplary magnetic disk drive.
Figure 2:
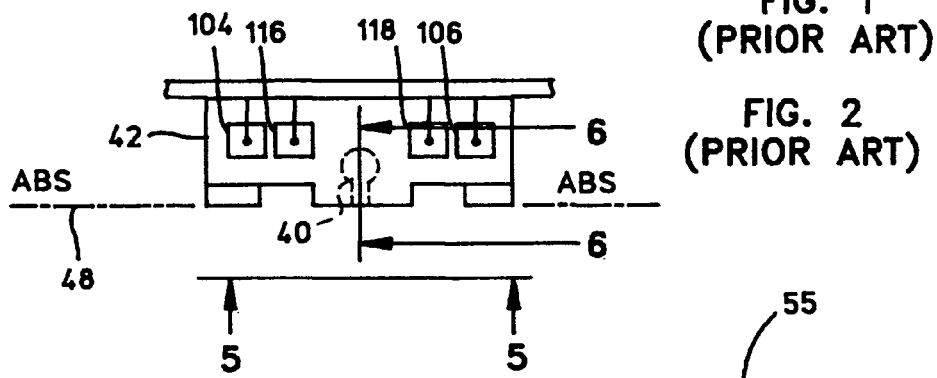
FIG. 2 is an end view of a slider with a magnetic head of the disk drive as seen in plane 2-2 of FIG. 1.
Figure 3:
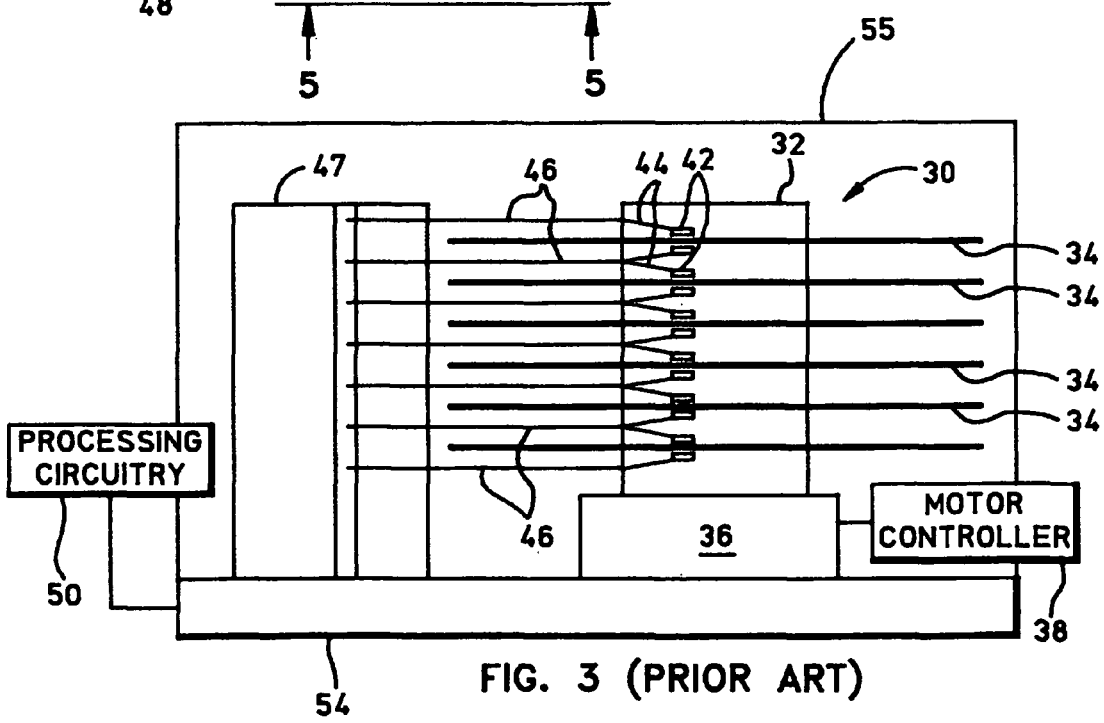
FIG. 3 is an elevation view of the magnetic disk drive wherein multiple disks and magnetic heads are employed.
Figure 4:
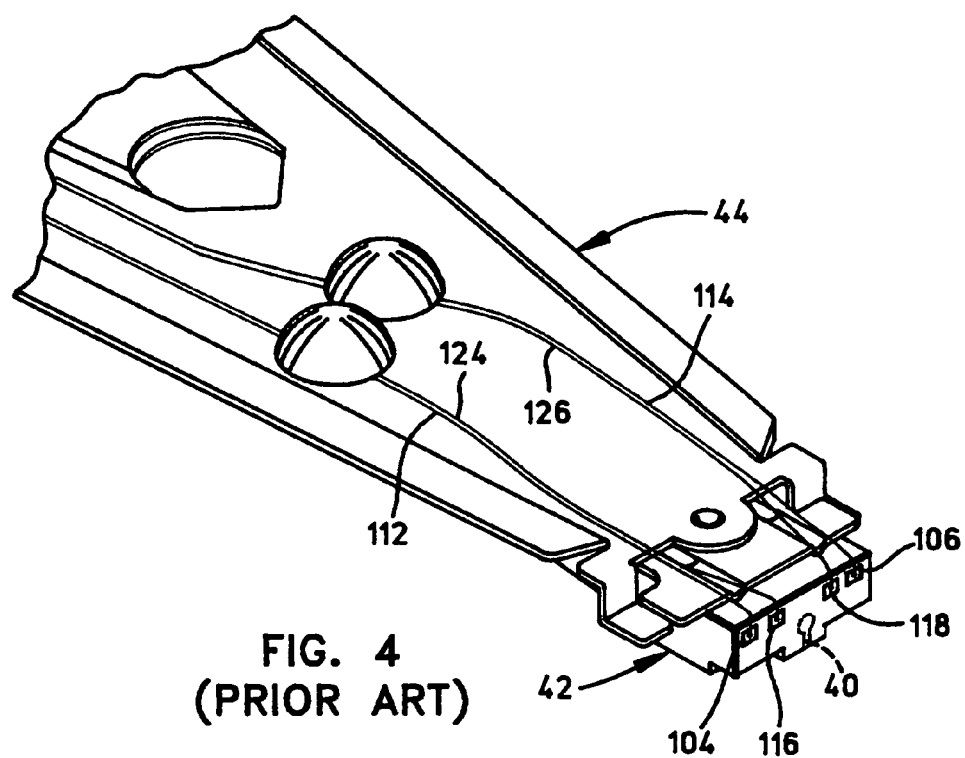
FIG. 4 is an isometric illustration of an exemplary suspension system for supporting the slider and magnetic head.
Figure 5:
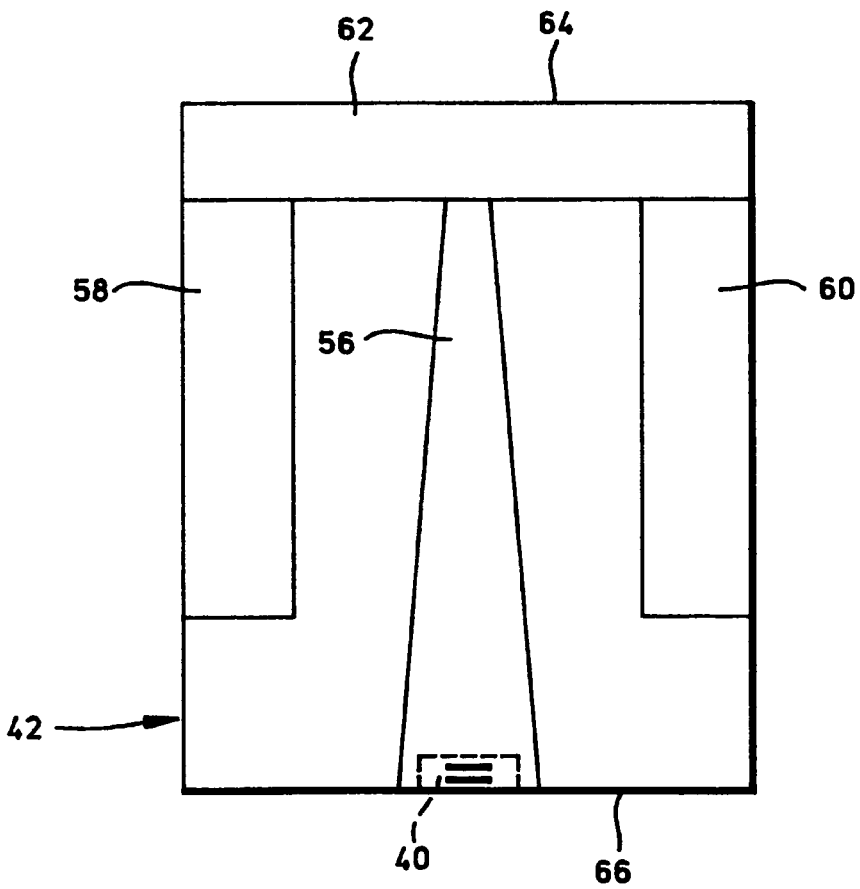
FIG. 5 is an air bearing surface (ABS) view of the magnetic head taken along plane 5-5 of FIG. 2.

Magnetic Disk Drive. Referring now to the drawings wherein like reference numerals designate like or similar parts throughout the several views, FIGS. 1-3 illustrate a magnetic disk drive 30. Disk drive 30 includes a spindle 32 that supports and rotates a magnetic disk 34. Spindle 32 is rotated by a spindle motor 36 that is controlled by a motor controller 38. A slider 42 includes a combined read and write magnetic head 40 and is supported by a suspension 44 and actuator arm 46 that is rotatably positioned by an actuator 47. Magnetic head 40 may utilize the read sensor which is made in accordance with the present invention. A plurality of disks, sliders, and suspensions may be employed in a large capacity direct access storage device (DASD) as shown in FIG. 3. Suspension 44 and actuator arm 46 are moved by actuator 47 to position slider 42 so that magnetic head 40 is in a transducing relationship with a surface of magnetic disk 34. When disk 34 is rotated by spindle motor 36, slider 42 is supported on a thin (typically, 10 to 15 nm) cushion of air (air bearing) between the surface of disk 34 and an air bearing surface (ABS) 48. Magnetic head 40 may then be employed for writing information to multiple circular tracks on the surface of disk 34, as well as for reading information therefrom. Processing circuitry 50 exchanges signals, representing such information, with head 40, provides spindle motor drive signals for rotating magnetic disk 34, and provides control signals to actuator 47 for moving slider 42 to various tracks. In FIG. 4, slider 42 is shown mounted to a suspension 44. The components described hereinabove may be mounted on a frame 54 of a housing 55, as shown in FIG. 3. FIG. 5 is an ABS view of slider 42 and magnetic head 40. Slider 42 has a center rail 56 that supports magnetic head 40, and side rails 58 and 60. Rails 56, 58 and 60 extend from a cross rail 62. With respect to rotation of magnetic disk 34, cross rail 62 is at a leading edge 64 of slider 42 and magnetic head 40 is at a trailing edge 66 of slider 42.

FIG. 6 is a side cross-sectional elevation view of a merged magnetic head 40, which includes a write head portion 70 and a read head portion 72. Read head portion 72 includes a giant magnetoresistive (GMR) read head which utilizes a spin valve sensor 74. FIG. 7 is an ABS view of FIG. 6. Spin valve sensor 74 is sandwiched between nonmagnetic electrically insulative first and second read gap layers 76 and 78, and read gap layers 76 and 78 are sandwiched between ferromagnetic first and second shield layers 80 and 82. In response to external magnetic fields, the resistance of spin valve sensor 74 changes. A sense current $I_s$ conducted through the sensor causes these resistance changes to be manifested as potential changes. These potential changes are then processed as readback signals by processing circuitry 50 shown in FIG. 3.

Write head portion 70 of magnetic head 40 includes a coil layer 84 sandwiched between first and second insulation layers 86 and 88. A third insulation layer 90 may be employed for planarizing the head to eliminate ripples in the second insulation layer caused by coil layer 84. The first, second and third insulation layers are referred to in the art as an "insulation stack". Coil layer 84 and first, second and third insulation layers 86, 88 and 90 are sandwiched between first and second pole piece layers 92 and 94. First and second pole piece layers 92 and 94 are magnetically coupled at a back gap 96 and have first and second pole tips 98 and 100 which are separated by a write gap layer 102 at the ABS. Since second shield layer 82 and first pole piece layer 92 are a common layer, this head is known as a merged head. In a piggyback head an insulation layer is located between a second shield layer and a first pole piece layer. As shown in FIGS. 2 and 4, first and second solder connections 104 and 106 connect leads from spin valve sensor 74 to leads 112 and 114 on suspension 44, and third and fourth solder connections 116 and 118 connect leads 120 and 122 from the coil 84 (see FIG. 8) to leads 124 and 126 on suspension 44.

Figure 9:
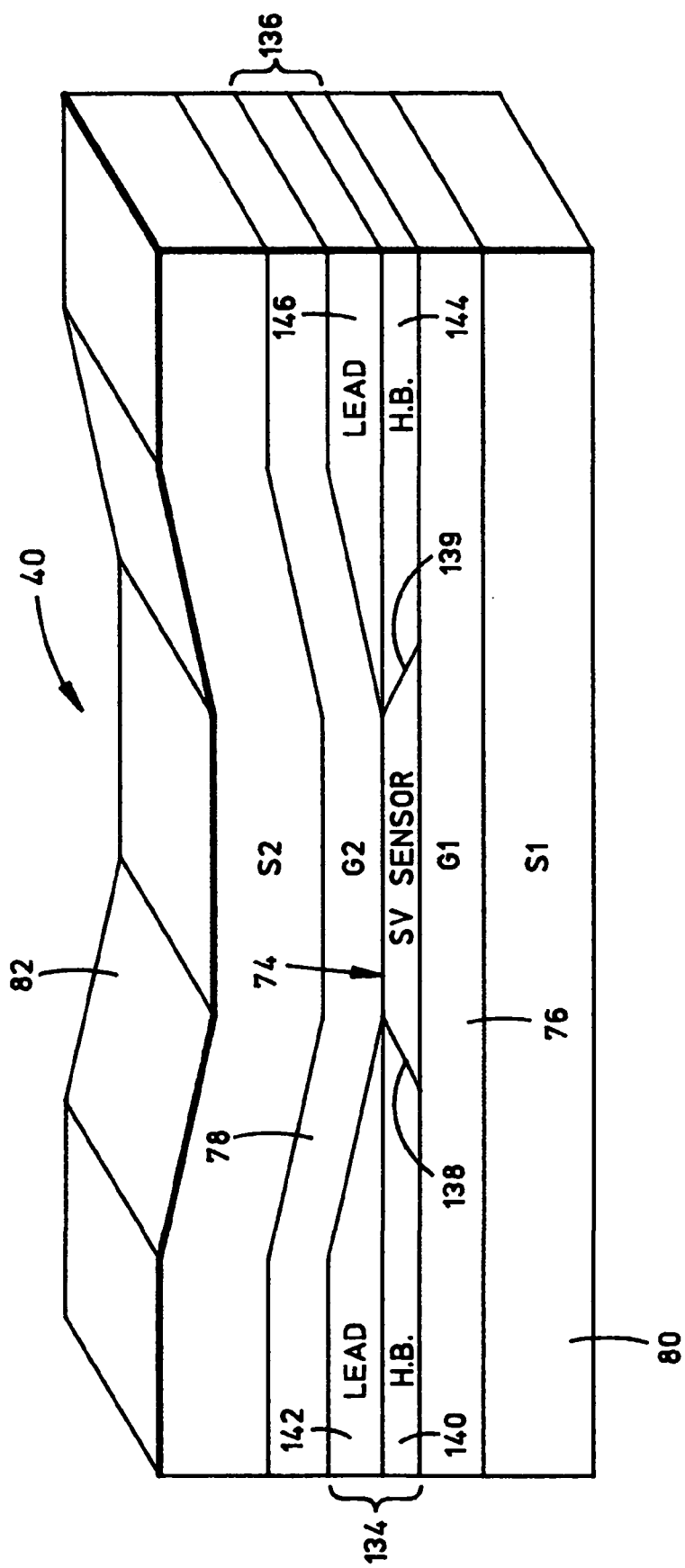
FIG. 9 is an enlarged isometric illustration of a read head having a spin valve sensor.

FIG. 9 is an enlarged isometric ABS illustration of read head 40 shown in FIG. 7 which includes spin valve sensor 74. First and second hard bias and lead layers 134 and 136 are connected to first and second side edges 138 and 139 of spin valve sensor 74. This connection is known in the art as a contiguous junction and is fully described in commonly assigned U.S. Pat. No. 5,018,037 which is incorporated by reference herein. First hard bias and lead layers 134 include a first hard bias layer 140 and a first lead layer 142, and second hard bias and lead layers 136 include a second hard bias layer 144 and a second lead layer 146. Hard bias layers 140 and 144 cause magnetic fields to extend longitudinally through spin valve sensor 74 for stabilizing the magnetic domains therein. Spin valve sensor 74 and first and second hard bias and lead layers 134 and 136 are located between the nonmagnetic electrically insulative first and second read gap layers 76 and 78. First and second read gap layers 76 and 78 are, in turn, located between ferromagnetic first and second shield layers 80 and 82.

Figure 10:
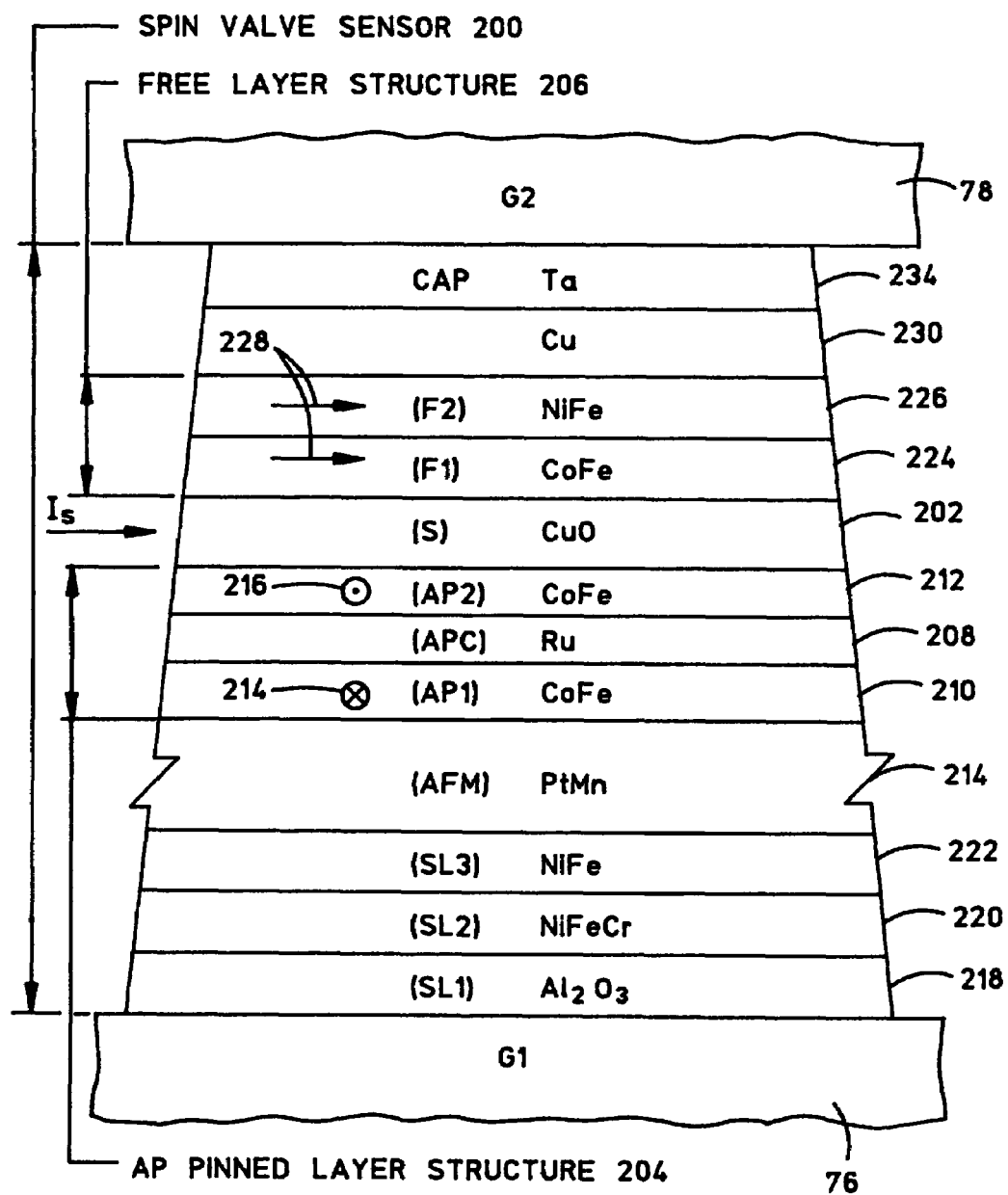
FIG. 10 is an ABS illustration of a typical multi-layer structure of a "bottom-type" spin valve sensor.

FIG. 10 shows an ABS illustration of a typical multi-layered structure of a "bottom-type" spin valve sensor 200 located between first and second read gap layers 76 and 78. Spin valve sensor 200 includes a non-magnetic electrically conductive spacer (S) layer 202 which is located between an antiparallel (AP) pinned layer structure 204 and a free layer structure 206. AP pinned layer structure 204 includes an antiparallel coupling (APC) layer 208 which is located between first and second ferromagnetic AP pinned layers (AP1) and (AP2) 210 and 212. First AP pinned layer 210 is exchange coupled to an antiferromagnetic (AFM) pinning layer 214 which pins a magnetic moment 214 of first AP pinned layer 210 perpendicular to the ABS in a direction out of or into sensor 200, as shown in FIG. 10. AFM pinning layer 214 is formed in the central region of sensor 200. By strong antiparallel coupling between first and second AP pinned layers 210 and 212, a magnetic moment 216 of second AP pinned layer 212 is antiparallel to magnetic moment 214. First, second, and third seed layers (SL1), (SL2) and (SL3) 218, 220, and 222 may be provided between first read gap layer 76 and pinning layer 214 for promoting a desirable texture of the layers deposited thereon. Free layer structure 206 includes first and second free ferromagnetic layers (F1) and (F2) 224 and 226, with first free layer 224 interfacing spacer layer 202. Free layer structure 224 has a magnetic moment 228 which is oriented parallel to the ABS and to the major planes of the layers in a direction from right to left, or from left to right, as shown in FIG. 10. Note that, in the "bottom-type" configuration, free layers 224 and 226 are located in the top portion of sensor 200. A cap or capping layer 234 is formed over free layer structure 206 for protecting the sensor.

When a signal field from the rotating magnetic disk rotates magnetic moment 228 into the sensor (i.e. into the paper), magnetic moments 228 and 216 become more anti-parallel which increases the resistance of the sensor to the sense current ($I_S$). When a signal field rotates magnetic moment 228 out of the sensor (i.e. out of the paper), magnetic moments 228 and 216 become more parallel which reduces the resistance of sensor 200 to the sense current ($I_S$). These resistance changes are processed as playback signals by processing circuitry (i.e. processing circuitry 50 of FIG. 3).

The following materials may be utilized in the multilayered spin valve sensor 200 of FIG. 10. First, second, and third seed layers are made of alumina ($Al_2O_3$), nickel-iron-chromium (NiFeCr), and nickel-iron (NiFe), respectively, from bottom to top; AFM layer 214 is made of platinum-manganese (PtMn) or alternatively of iridium-manganese (IrMn) AP pinned layers 210 and 212 are made of cobalt-iron (CoFe); APC layer 208 is made of ruthenium (Ru); first and second free layers 224 and 226 are made of cobalt-iron (CoFe) and nickel-iron (NiFe), respectively; spacer layer 202 is made of copper (Cu) or copper-oxide (CuO); and capping layer 234 is made of tantalum (Ta). A copper (Cu) layer 230 may be located on second free layer 226 for reflecting conduction electrons back into the mean free path of conduction electrons. Thicknesses of particular materials may be 3 nanometers (nm) of $Al_2O_3$ for first seed layer 218; 3 nm of NiFeCr for second seed layer 220; 1 nm of NiFe for third seed layer 222; 3 nm of PtMn for AFM layer 214, various thicknesses ranging from 1 to 3 nm of $Co_{90}Fe_{10}$ (where subscripts indicate weight percent of a particular element) for first AP pinned layer 210; 0.8 nm of Ru for APC layer 208; various thicknesses ranging from 1 to 3 nm of $Co_{90}Fe_{10}$ for second AP pinned layer 212; 2 nm of CuO for spacer layer 202; 1 nm of $Co_{90}Fe_{10}$ for first free layer 224; 1.6 nm of $Ni_{83}Fe_{17}$ (where subscripts indicate weight percent of a particular element) for second free layer 226; various thicknesses of Cu for second spacer layer 230; and 6 nm of Ta for capping layer 234.

Figure 11:
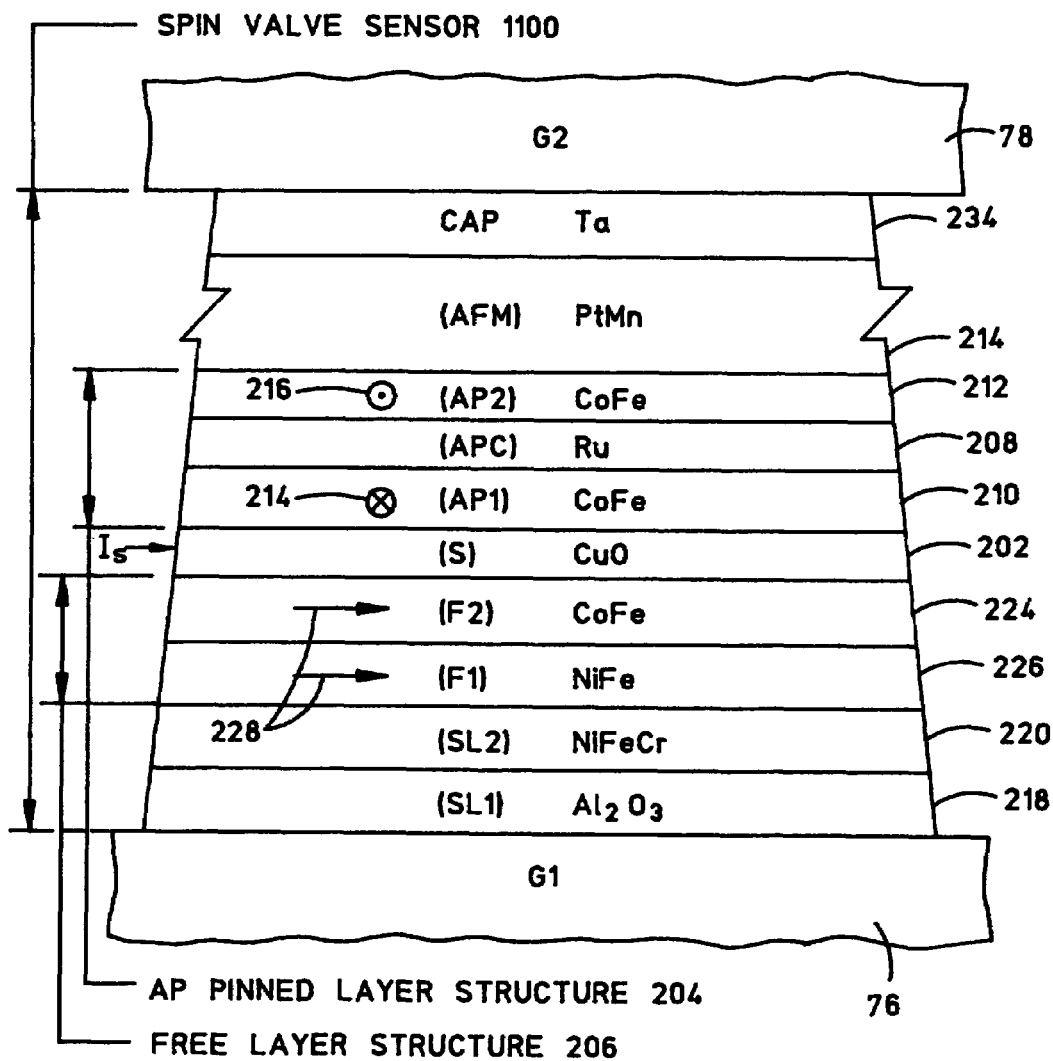
FIG. 11 is an ABS illustration of a typical multi-layer structure of a "top-type" spin valve sensor.

FIG. 11 shows an ABS illustration of a typical multi-layered structure of a "top-type" spin valve sensor 1100. As apparent, the spin valve sensor 1100 of FIG. 11 is substantially the same as that in FIG. 10 except that most layers are inverted. In the "top-type" configuration, free layer structure 206 is located in the lower portion the sensor whereas AP pinned layer structure 204 is located in the upper portion of the sensor. AFM pinning layer 214 is formed directly above AP pinned layer structure 204 in the central region.

Figure 12:
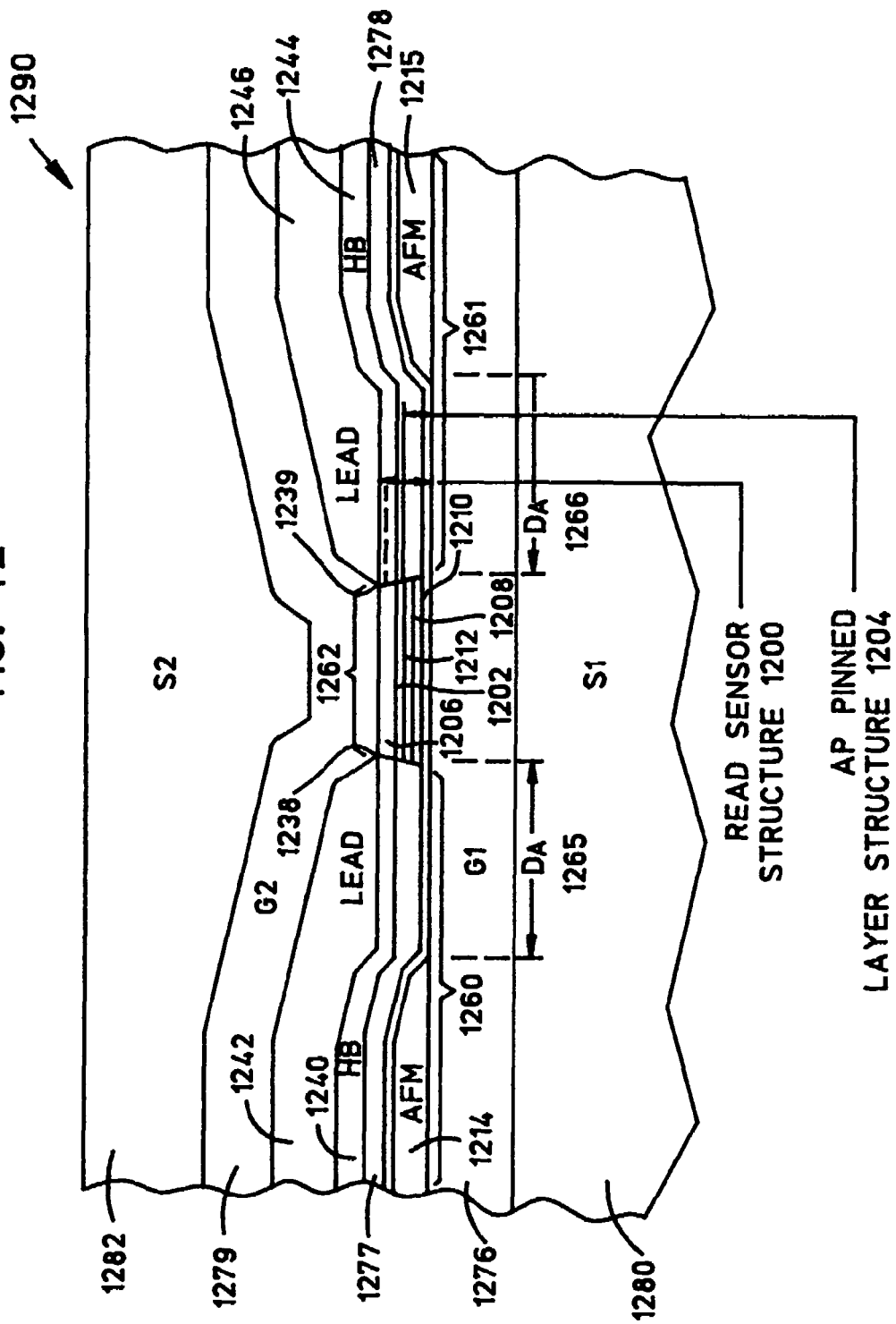
FIG. 12 is an ABS illustration of a bottom-type spin valve sensor with contiguous junctions, where antiferromagnetic (AFM) pinning layer structures in the end regions are utilized for pinning an anti-parallel (AP) pinned layer from the bottom.

FIG. 12 is an enlarged ABS illustration of a first embodiment of the present invention, a magnetic head 1290 which includes a "bottom-type" spin valve sensor. The spin valve sensor of FIG. 12 includes a read sensor structure 1200 formed primarily in a central region 1262 with contiguous junctions. Hard bias layers 1240 and 1244 and lead layers 1242 and 1246 are formed in end regions 1260 and 1261 so as to abut the contiguous junctions of read sensor structure 1200. First and second antiferromagnetic (AFM) pinning layer structures 1214 and 1215 are also formed in end regions 1260 and 1261 beneath hard bias layers 1240 and 1244, but are absent from central region 1262. First and second insulator layers 1277 and 1278, which are optional, may be formed in between AFM pinning layer structures 1214 and 1215 and hard bias layers 1240 and 1244, respectively. The entire structure is sandwiched in between first and second non-magnetic electrically-insulating gap layers 1276 and 1279, which are themselves sandwiched in between first and second ferromagnetic shield layers 1280 and 1282.

Read sensor structure 1200 includes a top free layer structure 1206, a bottom antiparallel (AP) pinned layer structure 1204, and a non-magnetic electrically-conductive spacer layer 1202 located between free layer structure 1206 and AP pinned layer structure 1204. AP pinned layer structure 1204, which is primarily formed in central region 1262, includes a first AP pinned layer 1210 (AP1), a second AP pinned layer 1212 (AP2), and an antiparallel coupling (APC) layer 1208 located between first and second AP pinned layers 1210 and 1212. First AP pinned layer 1210 is formed in central region 1262 and end regions 1260 and 1261. In particular, end portions of first AP pinned layer 1210 are formed over and in contact with first and second AFM pinning layer structures 1214 and 1215 in end regions 1260 and 1261. Note that edges of first and second AFM pinning layer structures 1214 and 1215 are separated from edges of read sensor structure 1200 by distances $D_A$ 1265 and 1266, respectively. Preferably, each distance $D_A$ 1265 and 1266 is between 0-0.2 microns.

Given the particular formation in FIG. 12, first and second AFM pinning layer structures 1214 and 1216 magnetically pin first AP pinned layer 1210 at a distance $D_A$ 1265 and 1266 away from the trackwidth edges. Intra-film exchange within first AP pinned layer 1210 couples the pinned orientation into central active region 1262 and resets first and second AP pinned layers 1210 and 1212 in the event they become flipped. This configuration helps prevent flipping of the pinned layer magnetization (large coercivity $H_k$ in the pinned layers also helps prevent flipping). This configuration also helps to restore the pinned layer orientations in the event they do become flipped. Advantageously, the spin valve sensor of FIG. 12 may be made as thin as a "self-pinned" sensor in central region 1362 where the signal is sensed without having amplitude flip concerns.

One way to manufacture magnetic head 1290 of FIG. 12 will now be described. Shield layer 1280 is formed on a surface of a wafer, followed by the formation of gap layer 1276. Next, a central resist is formed over gap layer 1276 and AFM pinning layer materials are deposited over the entire structure. Once the central resist is removed, first and second AFM pinning layer structures 1214 and 1215 are left in end regions 1260 and 1261. Each distance $D_A$ 1265 and 1266 is defined by the width of this central resist. Read sensor layers are then deposited in full film over the resulting structure beginning with the deposition of first AP pinned layer 1210. Utilizing a new central resist formed over the free layer, ion milling is performed to remove the read sensor materials in end regions 1260 and 1261 until first AP pinned layer 1210 is reached. The ion milling is then terminated so that first AP pinned layer 1210 is not removed in end regions 1260 and 1261. The trackwidth of the read sensor is defined by the width of this central resist. Thus, first and second side edges 1238 and 1239 of read sensor structure 1200 are formed to define the sensor's trackwidth, leaving it with contiguous junctions. With the central resist still in place, insulator materials (if utilized), hard bias, and lead materials are deposited over the entire structure. Once the central resist is removed, insulator layers 1277 and 1278 (if utilized), hard bias layers 1240 and 1244, and lead layers 1242 and 1246 remain in end regions 1260 and 1261. Since AFM pinning layer structures 1214 and 1215 are only partially formed in end regions 1214 and 1215, insulator layers, 1277 and 1278 (if utilized), hard bias layers 1240 and 1244, and lead layers 1242 and 1246 are formed so as to be flat but then raised over AFM pinning layer structures 1214 and 1215 in end regions 1214 and 1215 as shown in FIG. 12.

Figure 13:
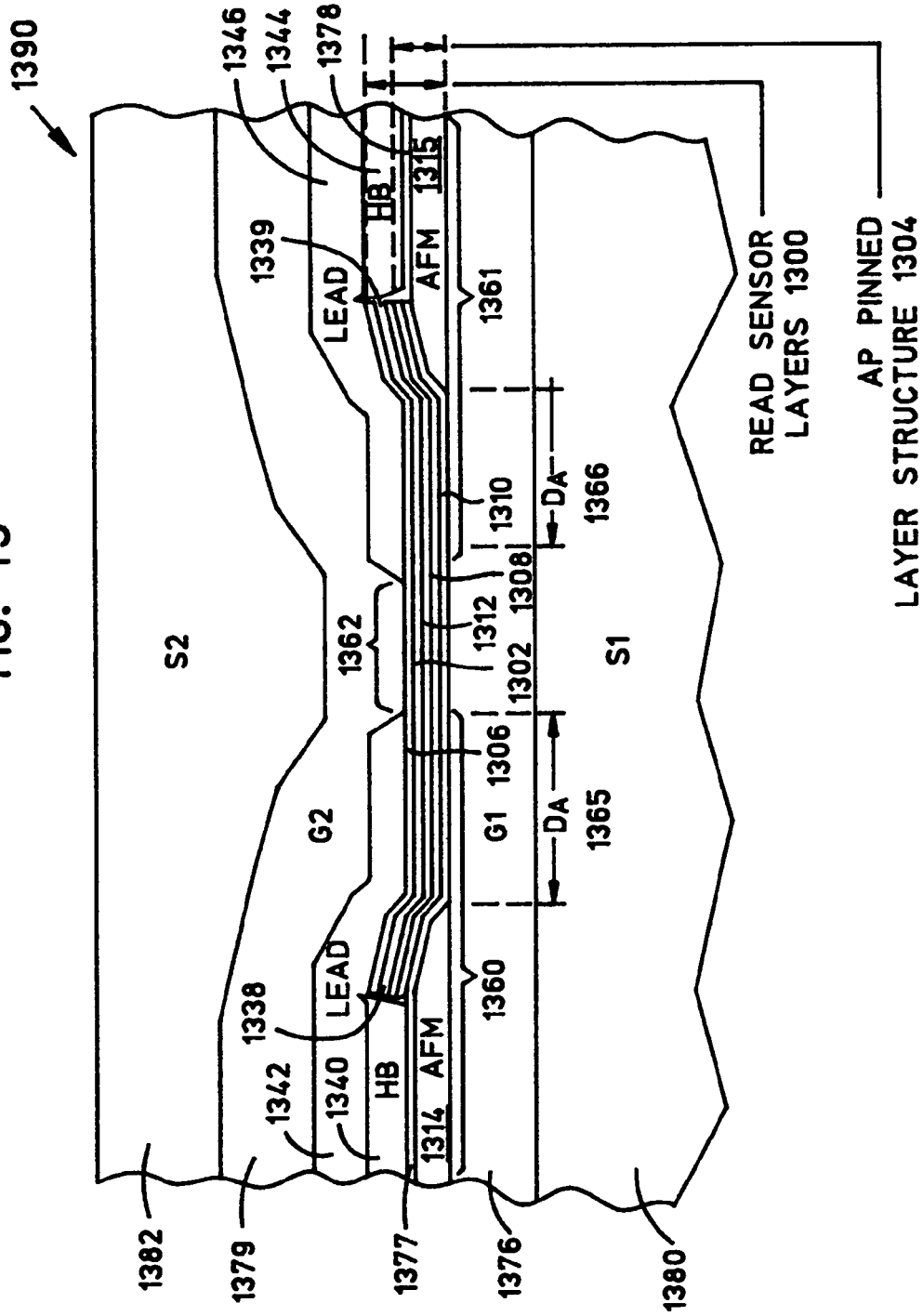
FIG. 13 is an ABS illustration of a lead-overlay "bottom-type" spin valve sensor, where AFM pinning layer structures in the end regions are utilized for pinning the AP pinned layer from the bottom.

FIG. 13 is an enlarged ABS illustration of a second embodiment of the present invention, a magnetic head 1390 which includes a "bottom-type" spin valve sensor having a lead-overlay configuration. The spin valve sensor of FIG. 13 includes a plurality of read sensor layers 1300 formed in a central region 1362 and extending at least partially through end regions 1360 and 1361. Lead layers 1342 and 1346 are formed in end regions 1360 and 1361, as well as over the top of read sensor layers 1300 inwards toward central region 1362 so that its inner edges define the trackwidth for the read sensor. Hard bias layers 1340 and 1344 are formed partially in end regions 1360 and 1361 so as to abut edges 1338 and 1339 of sensor layers 1300 as shown. First and second antiferromagnetic (AFM) pinning layer structures 1314 and 1315 are also formed in end regions 1360 and 1361 beneath hard bias layers 1340 and 1344 but are absent from central region 1362. First and second insulator layers 1377 and 1378, which are optional, are formed in between AFM pinning layer structures 1314 and 1315 and hard bias layers 1340 and 1344, respectively. This entire structure is sandwiched in between first and second non-magnetic electrically-insulating gap layers 1376 and 1379, which are themselves sandwiched in between first and second ferromagnetic shield layers 1380 and 1382.

Read sensor layers 1300 include a top free layer structure 1306, a bottom antiparallel (AP) pinned layer structure 1304, and a non-magnetic electrically-conductive spacer layer 1302 located between free layer structure 1306 and AP pinned layer structure 1304. AP pinned layer structure 1304 includes a first AP pinned layer 1310 (AP1), a second AP pinned layer 1312 (AP2), and an antiparallel coupling (APC) layer 1308 located between first and second AP pinned layers 1310 and 1312. End portions of first AP pinned layer 1310 are formed over and in contact with first and second AFM pinning layer structures 1314 and 1315 in end regions 1360 and 1361. Note that edges of first and second AFM pinning layer structures 1314 and 1315 are separated from the edges of the trackwidth of the read sensor by distances $D_A$ 1365 and 1366, respectively. Preferably, each distance $D_A$ 1365 and 1366 is between 0-0.2 microns.

Given the particular formation in FIG. 13, first and second AFM pinning layer structures 1314 and 1316 magnetically pin first AP pinned layer 1310 at a distance $D_A$ 1365 and 1366 away from the trackwidth edges. Intra-film exchange within first AP pinned layer 1310 couples the pinned orientation into central active region 1362 and resets first and second AP pinned layers 1310 and 1312 in the event they become flipped. This configuration helps prevent flipping of the pinned layer magnetization (large coercivity $H_k$ in the pinned layers also helps prevent flipping). This configuration also helps to restore the pinned layer orientations in the event they do become flipped. Advantageously, the spin valve sensor of FIG. 13 may be made as thin as a "self-pinned" sensor in central region 1362 where the signal is sensed without having amplitude flip concerns.

One way to manufacture magnetic head 1390 of FIG. 13 will now be described. Shield layer 1380 is formed on a surface of a silicon wafer, followed by the formation of gap layer 1376. Next, a central resist is formed over gap layer 1376 and AFM pinning layer materials are deposited over the entire structure. Once the central resist is removed, first and second AFM pinning layer structures 1314 and 1315 remain in end regions 1360 and 1361. Each distance $D_A$ 1365 and 1366 is defined by the width of this central resist. Read sensor layers are then deposited in full film over the resulting structure beginning with the deposition of first AP pinned layer 1310. Utilizing a new central resist formed over the free layer, ion milling is performed to remove the read sensor materials far outside of end regions 1360 and 1361. The ion milling is terminated when first and second AFM pinning layer structures 1314 and 1315 are reached. Hard bias materials are then deposited over the entire structure and the central resist is removed, to thereby form hard bias layers 1340 and 1344 in the far outside end regions 1360 and 1361. Using yet a new central resist, lead layer materials are deposited over the entire structure and, when this new central resist is removed, lead layers 1342 and 1346 remain such that its inner edges define the sensor's trackwidth. Since AFM pinning layer structures 1314 and 1315 are only partially formed in end regions 1314 and 1315, read sensor layers 1300 and lead layers 1342 and 1346 are formed so as to be flat but then raised over AFM pinning layer structures 1314 and 1315 as shown in FIG. 13.

Figure 14:
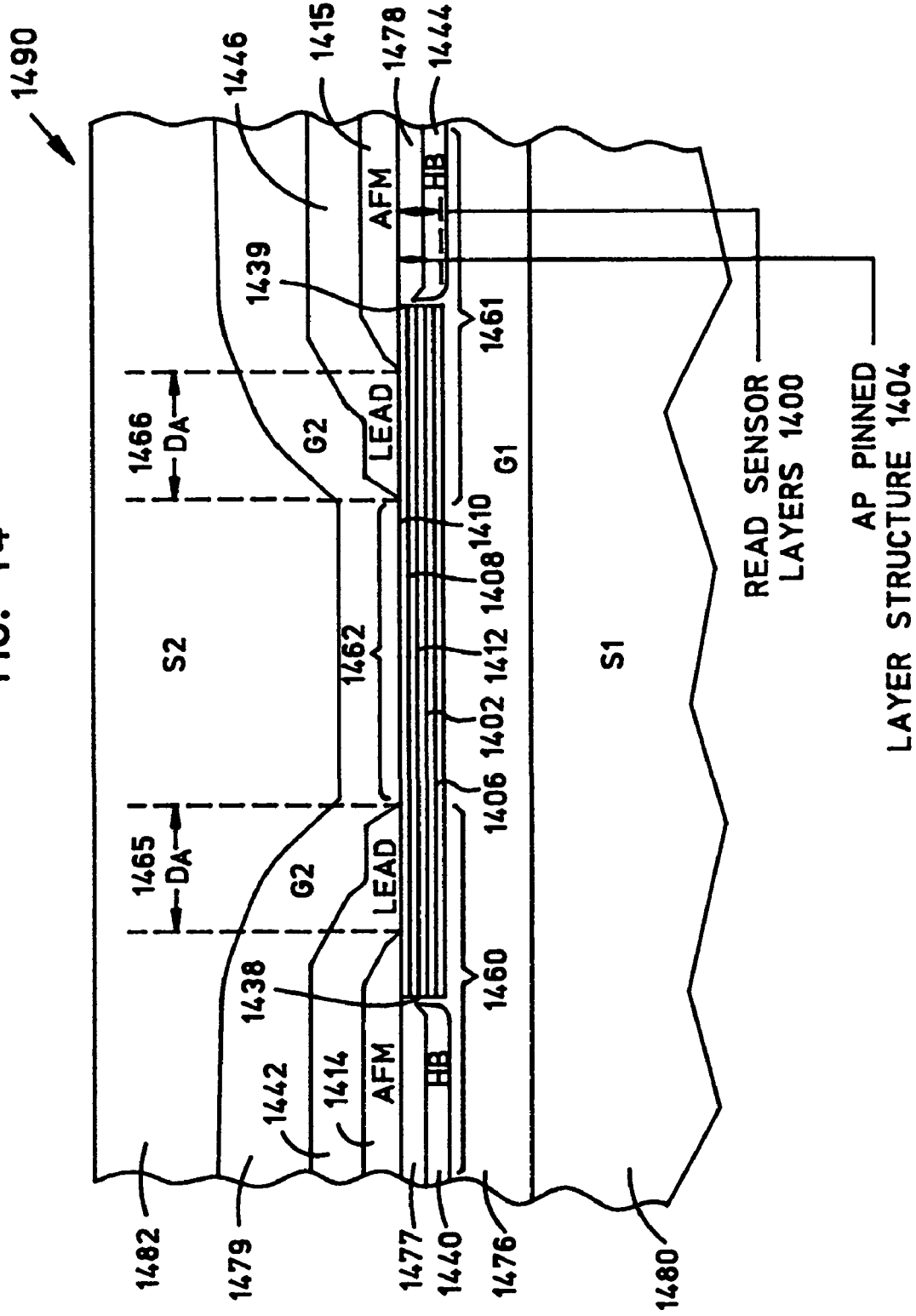
FIG. 14 is an ABS illustration of a lead-overlay "top-type" spin valve sensor, where AFM pinning layer structures in the end regions are utilized for pinning the AP pinned layer from the top.

FIG. 14 is an enlarged ABS illustration of a third embodiment of the present invention, a magnetic head 1490 which includes a "top-type" spin valve sensor having a lead-overlay configuration. The spin valve sensor of FIG. 14 includes a plurality of read sensor layers 1400 formed in a central region 1462 which extend at least partially through end regions 1460 and 1461. Lead layers 1442 and 1446 are formed in end regions 1460 and 1461 and over the top of read sensor layers 1400 inwards toward central region 1462 so that its inner edges define the trackwidth for the read sensor. Hard bias layers 1440 and 1444 are formed partially in end regions 1460 and 1461 so as to abut edges 1438 and 1439 of sensor layers 1400 as shown. First and second antiferromagnetic (AFM) pinning layer structures 1414 and 1415 are also formed in end regions 1460 and 1461 above hard bias layers 1440 and 1444 but are absent from central region 1462. First and second insulator layers 1477 and 1478, which are optional, separate first and second AFM pinning layer structures 1414 and 1415 from hard bias layers 1440 and 1444, respectively. This entire structure is sandwiched in between first and second non-magnetic electrically-insulating gap layers 1476 and 1479, which are themselves sandwiched in between first and second ferromagnetic shield layers 1480 and 1482.

Read sensor layers 1400 include a bottom free layer structure 1406, a top antiparallel (AP) pinned layer structure 1404, and a non-magnetic electrically-conductive spacer layer 1402 located between free layer structure 1406 and AP pinned layer structure 1404. AP pinned layer structure 1404 includes a first AP pinned layer 1410 (AP1), a second AP pinned layer 1412 (AP2), and an antiparallel coupling (APC) layer 1408 located between first and second AP pinned layers 1410 and 1412. End portions of first AP pinned layer 1410 are formed beneath and in contact with first and second AFM pinning layer structures 1414 and 1415 in end regions 1460 and 1461. Note that edges of first and second AFM pinning layer structures 1414 and 1415 are separated from the trackwidth edges by distances $D_A$ 1465 and 1466, respectively. Preferably, each distance $D_A$ 1465 and 1466 is between 0-0.2 microns.

Given the particular formation in FIG. 14, first and second AFM pinning layer structures 1414 and 1416 magnetically pin first AP pinned layer 1410 at a distance $D_A$ 1465 and 1466 away from the trackwidth edges. Intra-film exchange within first AP pinned layer 1410 couples the pinned orientation into central active region 1462 and resets first and second AP pinned layers 1410 and 1412 in the event they become flipped. This configuration helps prevent flipping of the pinned layer magnetization (large coercivity $H_k$ in the pinned layers also helps prevent flipping). This configuration also helps to restore the pinned layer orientations in the event they do become flipped. Advantageously, the spin valve sensor of FIG. 14 may be made as thin as a "self-pinned" sensor in central region 1462 where the signal is sensed without having amplitude flip concerns.

One way to manufacture magnetic head 1490 of FIG. 14 will now be described. Shield layer 1480 is formed on a surface of a wafer, followed by the formation of gap layer 1476. Read sensor layers 1400 are then deposited over the resulting structure beginning with the deposition of free layer 1406. Utilizing a central resist formed over read sensor layers, 1400, ion milling is performed to remove read sensor materials far outside end regions 1460 and 1461. The ion milling is terminated when gap layer 1476 is reached. Hard bias materials and insulator materials (if utilized) are then deposited over the entire structure, and the central resist is removed which results in the formation of hard bias layers 1440 and 1444 and insulator layers 1477 and 1478 (if utilized) in the far outside end regions 1460 and 1461. Using a new central resist, AFM pinning layer materials are deposited over the entire structure. When this central resist is removed, AFM pinning layer structures 1414 and 1415 remain in end regions 1460 and 1461. The width of this central resist defines the distance $D_A$. Using yet a new central resist, lead layer materials are deposited over the entire structure. When this new central resist is removed, lead layers 1442 and 1446 are thereby formed such that its inner edges define the sensor's trackwidth. Since AFM pinning layer structures 1414 and 1415 are formed in end regions 1414 and 1415 over read sensor layers 1400, read sensor layers 1400 are formed so as to be flat as shown in FIG. 14.

Figure 15:
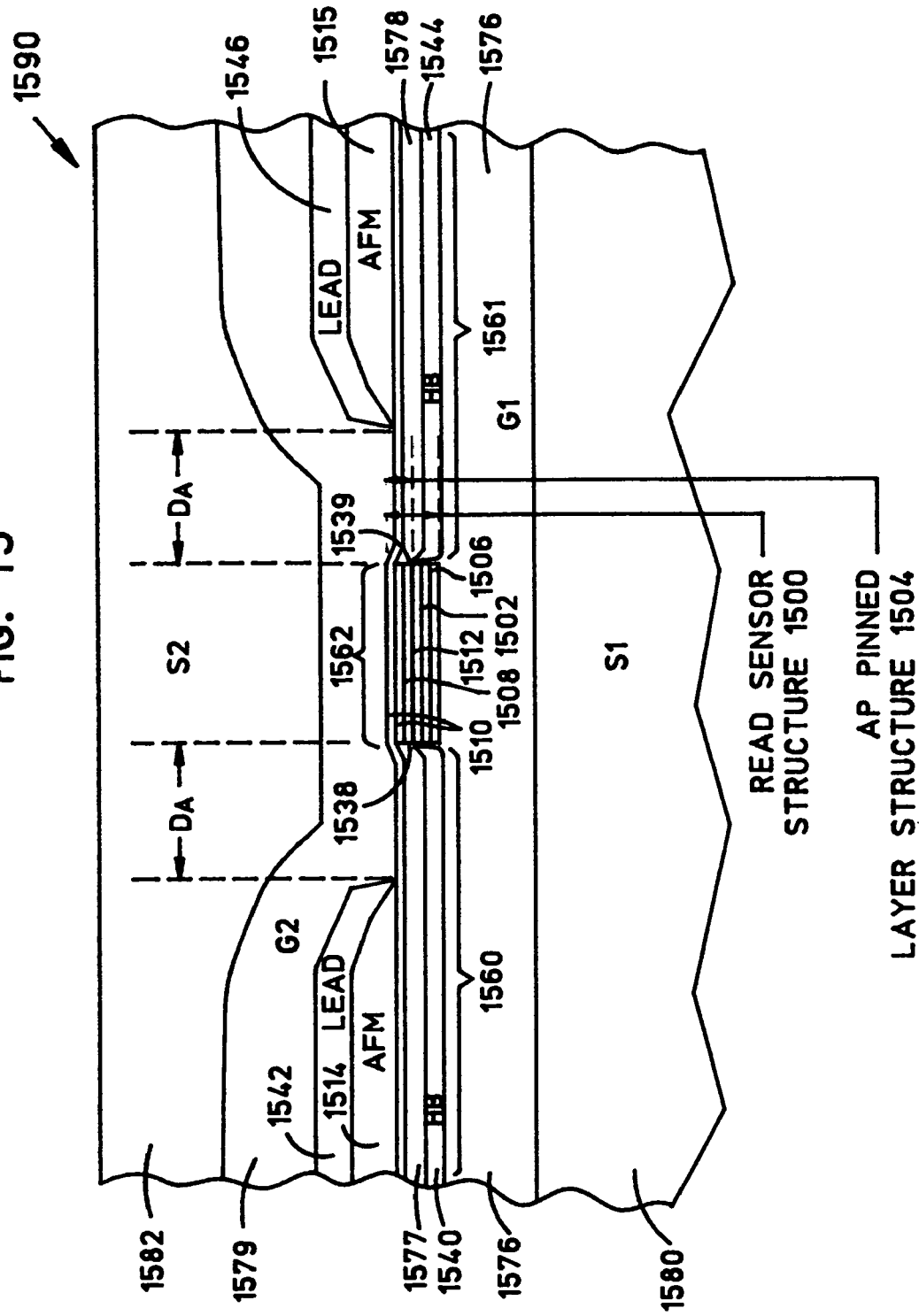
FIG. 15 is an ABS illustration of a "top-type" spin valve sensor with abutted junctions, where AFM pinning layer structures in the end regions are utilized for pinning the AP pinned layer from the top.

FIG. 15 is an enlarged ABS illustration of a fourth embodiment of the present invention, a magnetic head 1590 which includes a "top-type" spin valve sensor. The spin valve sensor of FIG. 15 includes a read sensor structure 1500 of the top-type formed in a central region 1562 with abutted junctions. Read sensor structure 1500 includes a bottom free layer structure 1506, a top antiparallel (AP) pinned layer structure 1504, and a non-magnetic electrically-conductive spacer layer 1502 located between free layer structure 1506 and AP pinned layer structure 1504. AP pinned layer structure 1504, which is primarily formed in central region 1562, includes a first AP pinned layer 1510 (AP1), a second AP pinned layer 1512 (AP2), and an antiparallel coupling (APC) layer 1508 located between first and second AP pinned layers 1510 and 1512. In this embodiment, first AP pinned layer 1510 is a bi-layer structure having a top layer and a bottom layer. The top layer of first AP pinned layer 1510 is formed in central region 1562 and end regions 1560 and 1561. The bottom layer of first AP pinned layer 1510 is formed only in central region 1562 underneath and in contact with the top layer. End portions of the top layer of first AP pinned layer 1510 are formed beneath and in contact with first and second antiferromagnetic (AFM) pinning layer structures 1514 and 1515 in end regions 1560 and 1561.

First and second AFM pinning layer structures 1514 and 1515 are formed beneath lead layers 1542 and 1546 in end regions 1560 and 1561 but are absent from central region 1562. Note that inner edges of first and second AFM pinning layer structures 1514 and 1515 are separated from outside edges 1538 and 1539 of read sensor structure 1500 by distances $D_A$ 1560 and 1561. Preferably, each distance $D_A$ 1560 and 1561 is between 0-0.2 microns. Just above gap layer 1576, hard bias layers 1540 and 1544 are formed in end regions 1560 and 1561 so as to abut the junctions of read sensor structure 1500. First and second insulator layers 1577 and 1578, which are optional, are formed in between hard bias layers 1540 and 1544 and first AP pinned layer 1510. The entire structure is sandwiched in between first and second non-magnetic electrically-insulating gap layers 1576 and 1579, which are themselves sandwiched in between first and second ferromagnetic shield layers 1580 and 1582.

Given the particular formation in FIG. 15, first and second AFM pinning layer structures 1514 and 1516 magnetically pin first AP pinned layer 1510 at a distance $D_A$ 1565 and 1566 away from the trackwidth edges. Intra-film exchange within first AP pinned layer 1510 couples the pinned orientation into central active region 1562 and resets first and second AP pinned layers 1510 and 1512 in the event they become flipped. This configuration helps prevent flipping of the pinned layer magnetization (large coercivity $H_k$ in the pinned layers also helps prevent flipping). This configuration also helps to restore the pinned layer orientations in the event they do become flipped. Advantageously, the spin valve sensor of FIG. 15 may be made as thin as a "self-pinned" sensor in central region 1562 where the signal is sensed without having amplitude flip concerns.

One way to manufacture magnetic head 1590 of FIG. 15 will now be described. Shield layer 1580 is formed on a surface of a wafer, followed by the formation of gap layer 1576. Full-film read sensor layers (which includes the bottom layer—not the top layer—of the first AP pinned layer) are then deposited over the resulting structure beginning with the deposition of free layer. Utilizing a central resist formed over the free layer, ion milling is performed to remove read sensor materials in end regions 1560 and 1561. The ion milling is terminated when gap layer 1576 is reached. Hard bias materials and insulator materials (if utilized) are then deposited over the entire structure, and the central resist is removed which results in the formation of hard bias layers 1540 and 1544 and insulator layers 1577 and 1578 (if utilized) in end regions 1560 and 1561. The top layer of first AP pinned layer 1510 is then deposited over the structure. Using a new central resist, AFM pinning layer materials are then deposited over the entire structure, followed by the deposition of lead layer materials. The width of this central resist defines the distance $D_A$. When this central resist is removed, AFM pinning layer structures 1514 and 1515 and lead layers 1542 and 1546 are formed in end regions 1560 and 1561.

Figure 16:
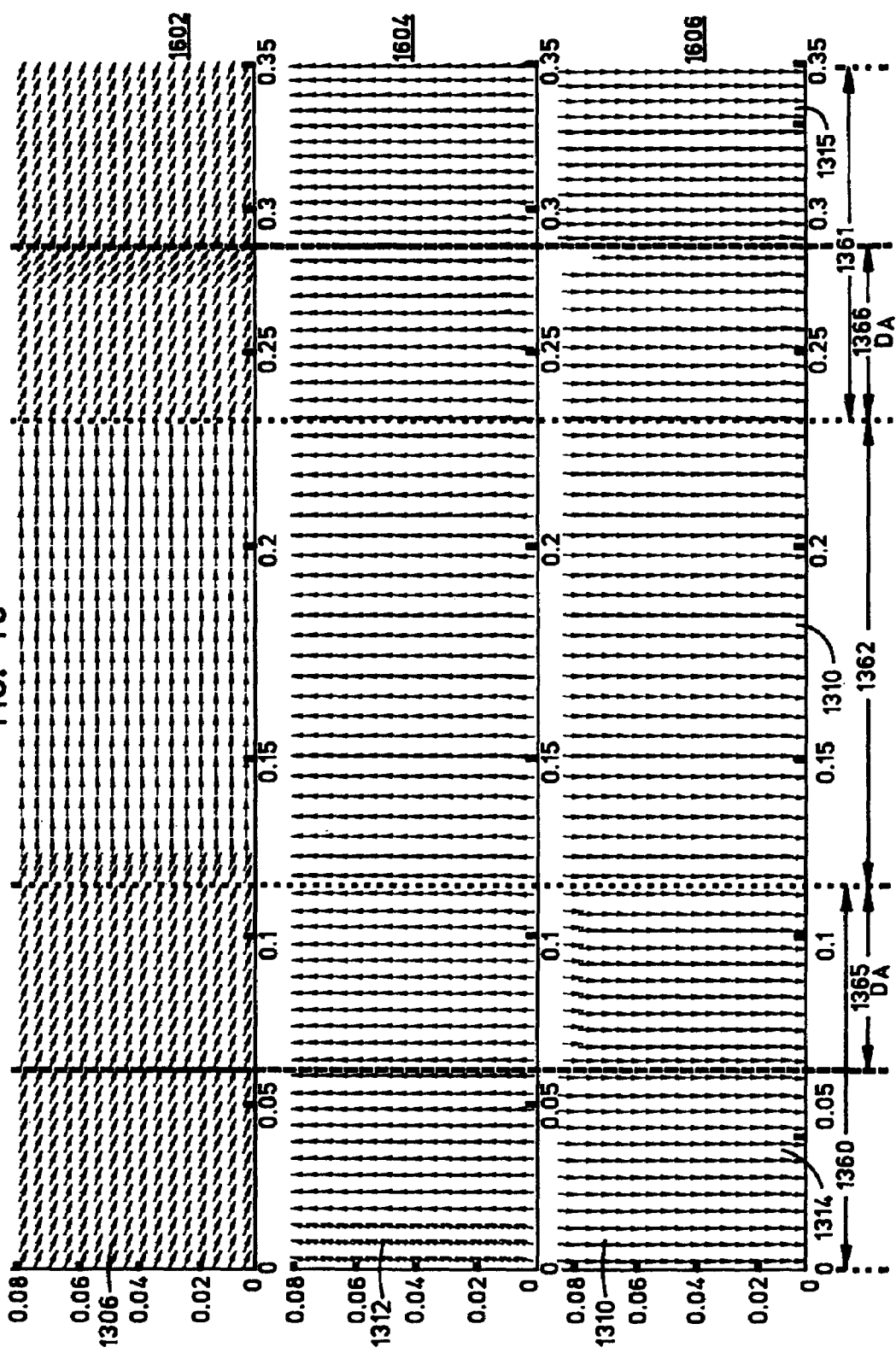
FIG. 16 are magnetic field plots of a lead-overlay bottom-type spin valve sensor of FIG. 13 in a normal magnetization state.

FIG. 16 are magnetization plots 1602, 1604, and 1606 associated with a spin valve sensor of the present invention. The example of FIG. 16 is associated with the spin valve sensor of FIG. 13 but is representative of the other configurations. Plot 1602 corresponds to the free layer (e.g. free layer 1306 of FIG. 13), plot 1604 corresponds to the second AP pinned layer (e.g. second AP pinned layer 1312 of FIG. 13), and plot 1606 corresponds to the first AP pinned layer (e.g. first AP pinned layer 1310 of FIG. 13). The modeling reveals that the distances $D_A$ 1365 and 1366 between the edges of the AFM pinning layer structures and the trackwidth may take quite reasonable, relaxed values. In this example, the trackwidth of central region 1362 is about 110 nanometers (nm), each distance $D_A$ 1365 and 1366 is about 80 nm, and end regions 1360 and 1361 each have a width of about 60 nm. A design value for the magnetic state current is maintained at −1.76 milliamperes (mA) with a coercivity $H_k$ of 300 Oersteds (Oe) for first AP pinned layer 1310 and second AP pinned layer 1312 (transverse to the long axis of the films in FIG. 16). As indicated by the arrows in plots 1602, 1604, and 1606, angles associated with magnetization in first AP pinned layer 1310, second AP pinned layer 1312, and free layer structure 1306 are −90°, +90°, and 0°, respectively. This is the desirable magnetic state of the spin valve sensor.

Figure 17:
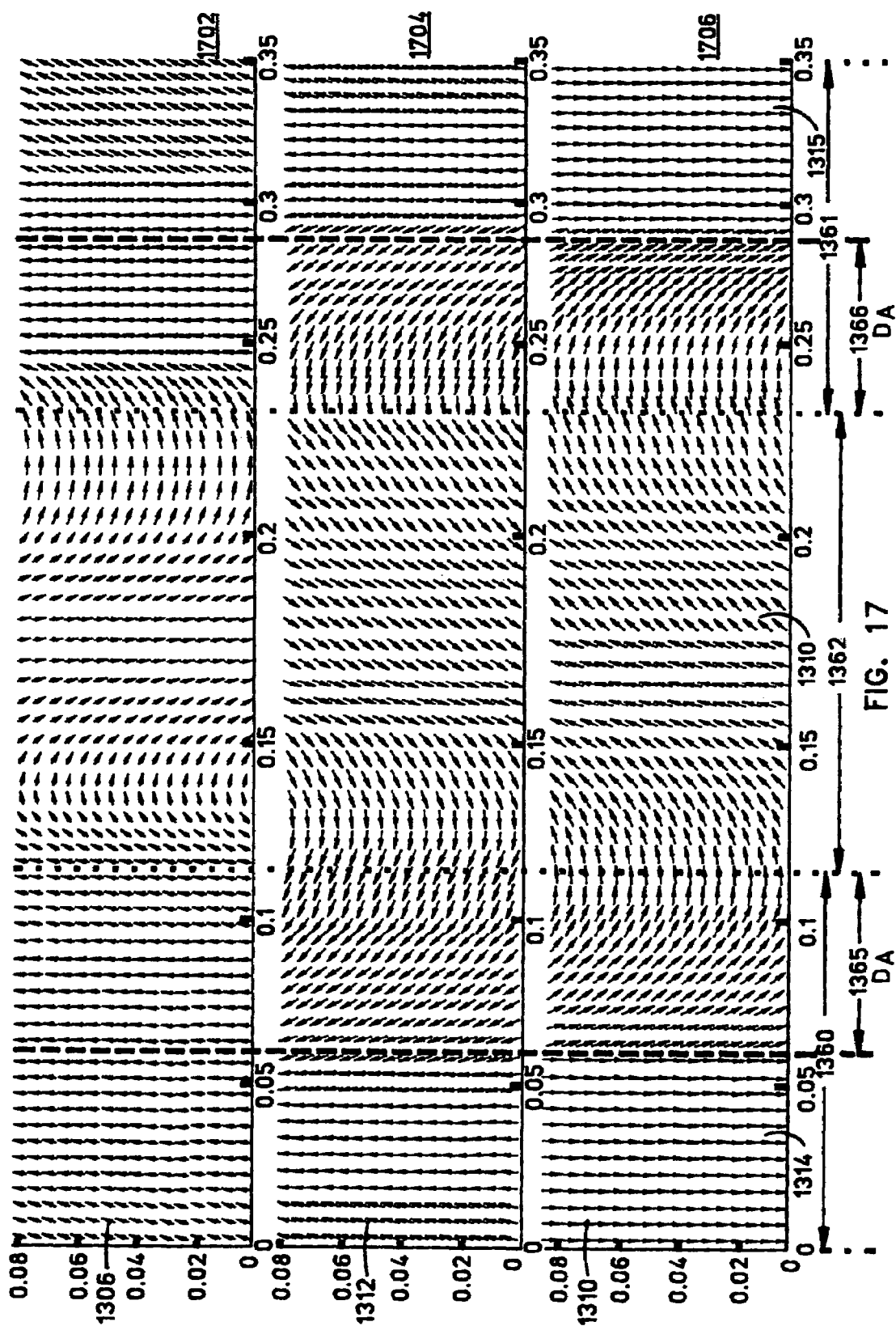
FIG. 17 are magnetic field plots of the spin valve sensor of FIG. 13 in a forced "amplitude-flipped" state.
Figure 18:
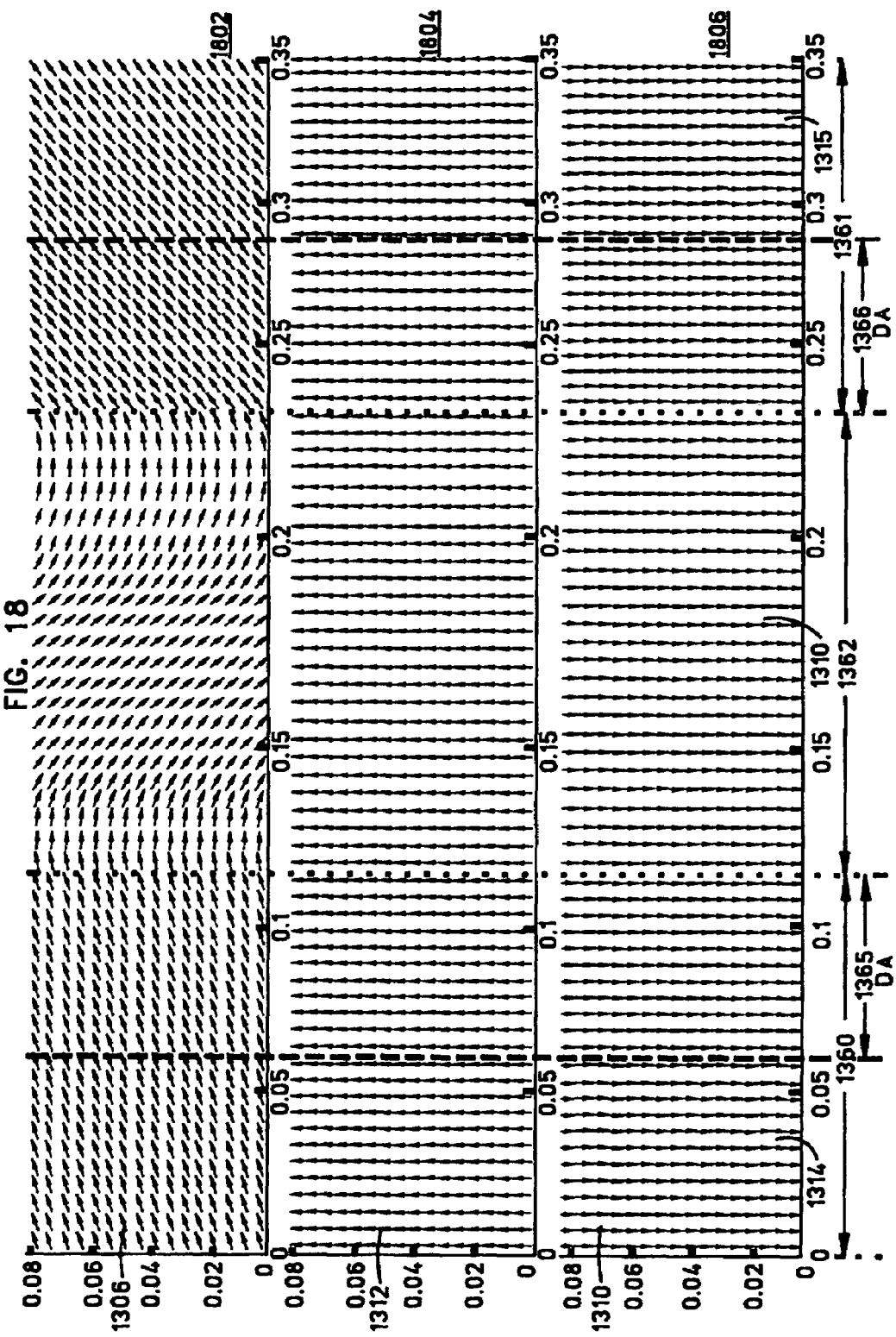
FIG. 18 are magnetic field plots of the spin valve sensor of FIG. 13 which has been restored to the normal magnetization state.

FIG. 17 are magnetic field plots 1702, 1704, and 1706 of the same spin valve sensor in an "amplitude-flipped" state which is created by changing the current to +20 mA from −1.76 mA. Such a large reverse current provides a convenient way of artificially producing the flipped state in the spin valve sensor. Similar to FIG. 16, plot 1702 corresponds to the free layer (e.g. free layer 1306 of FIG. 13), plot 1704 corresponds to the second AP pinned layer (e.g. second AP pinned layer 1312 of FIG. 13), and plot 1706 corresponds to the first AP pinned layer (e.g. first AP pinned layer 1310 of FIG. 13). As indicated by the arrows in plots 1702, 1704, and 1706, the angles associated with magnetic field lines for first and second AP pinned layers 1310 and 1312 are +70° and −110°, respectively. As apparent, the magnetization has rotated from the desired pinned field direction (−90° and +90°) in AFM pinning regions 1314 and 1315 to the undesired flipped direction (+90° and −90°) in central active region 1362. This results in a substantial increase in the exchange energy due to the intra-film exchange coupling, which is lowest for spatially uniform magnetic states. Put another way, the intra-film exchange energy couples the magnetization of first and second AP pinned layers 1310 and 1312 in AFM pinning regions 1360 and 1361 to the magnetization of central active region 1362, which exerts a restoring torque to spontaneously restore the magnetization of first and second AP pinned layers 1310 and 1312 (if not for the reverse current). As the current is decreased from +20 mA to +5 mA in steps of 5 mA, at a current somewhere between +10 mA and +5 mA, first and second AP pinned layers 1310 and 1312 self-restore spontaneously. As illustrated in plots 1802, 1804, and 1806 of FIG. 18, when the magnetization current is further reduced to −1.76 mA, free layer 1306 returns to its original bias angle.

Final Comments. As described herein, a spin valve sensor has first and second antiferromagnetic (AFM) pinning layer structures formed in the end regions. In one illustrative embodiment of the invention, the spin valve sensor includes a free layer structure; an anti-parallel (AP) pinned layer structure which includes at least a first AP pinned layer; and a non-magnetic electrically conductive spacer layer formed between the free layer structure and the AP pinned layer structure. First and second AFM pinning layer structures for magnetically pinning the first AP pinned layer are formed in end regions of the sensor but are absent from a central region of the sensor. The first AP pinned layer is formed in both the central region and the end regions so as to be in contact with the first and second AFM pinning layer structures. Advantageously, adequate pinning properties are exhibited in a sensor which provides the benefits of a self-pinned sensor (i.e. a reduced sensor profile in the central region).

A magnetic head of the present invention includes first and second shield layers; first and second gap layers sandwiched in between the first and second shield layers; a spin valve sensor formed between the first and the second gap layers. The spin valve sensor includes a free layer structure; an anti-parallel (AP) pinned layer structure; and a non-magnetic electrically conductive spacer layer formed between the free layer structure and the AP pinned layer structure. The AP pinned layer structure includes a first AP pinned layer; a second AP pinned layer; an anti-parallel coupling (APC) layer formed between the first and the second AP pinned layers. First and second antiferromagnetic (AFM) pinning layer structures are formed in end regions of the sensor but absent from a central region of the sensor. A disk drive of the present invention may include a housing; a magnetic disk rotatably supported in the housing; a magnetic head; a support mounted in the housing for supporting the magnetic head so as to be in a transducing relationship with the magnetic disk; a spindle motor for rotating the magnetic disk; an actuator positioning means connected to the support for moving the magnetic head to multiple positions with respect to said magnetic disk; a processor connected to the magnetic head assembly, to the spindle motor, and to the actuator for exchanging signals with the magnetic head for controlling movement of the magnetic disk and for controlling the position of the magnetic head; the magnetic head assembly including a read head having a spin valve sensor as described above.

It is to be understood that the above is merely a description of preferred embodiments of the invention and that various changes, alterations, and variations may be made without departing from the true spirit and scope of the invention as set for in the appended claims. For example, the optional insulator layers shown in relation to FIGS. 12-15 may hot be utilized nor be practical for at least some magnetic head designs. Few if any of the terms or phrases in the specification and claims have been given any special meaning different from their plain language meaning, and therefore the specification is not to be used to define terms in an unduly narrow sense.

What is claimed is:

1. A spin valve sensor, comprising:
    a first gap layer;
    a free layer structure;
    an antiparallel pinned (AP) layer structure formed over the first gap layer;
    a non-magnetic electrically conductive spacer layer formed between the free layer structure and the AP pinned layer structure;
    first and second antiferromagnetic (AFM) pinning layer structures formed over the first gap layer in end regions of the sensor but absent from a central region of the sensor;
    the AP pinned layer structure including;
        a first AP pinned layer;
        a second AP pinned layer;
        an anti-parallel coupling (APC) layer formed between the first and the second AP pinned layers;
        the first AP pinned layer being formed in the central region and over the first and the second AFM pinning layer structures in the end regions;
    first and second lead layers formed in the end regions; and
    a second gap layer formed over the first and second lead layers in the end regions and over the sensor in the central region.

2. The spin valve sensor of claim 1, further comprising:
    first and second hard bias layers formed underneath the first and the second lead layers, respectively, in the end regions.

3. The spin valve sensor of claim 1, further comprising:
    first and second hard bias layers formed underneath the first and the second lead layers, respectively, in the end regions; and
    first and second insulator layers formed in between the first and the second hard bias layers and the first AP pinned layer in the end regions.

4. The spin valve sensor of claim 1,
    wherein the first and second AFM pinning layer structures are formed adjacent to and in contact with the first AP pinned layer in the end regions.

5. The spin valve sensor of claim 1, further comprising:
    wherein the first and second AFM pinning layer structures are formed adjacent to and in contact with the first AP pinned layer in the end regions; and
    wherein each one of the first and the second AFM pinning layer structures is separated a distance $D_A$ from edges of an active sensor region of the sensor.

6. The spin valve sensor of claim 1, further comprising:
    the first and the second lead layers formed over the sensor such that its edges define a trackwidth for the sensor.

7. A magnetic head, comprising:
    first and second shield layers;
    first and second gap layers sandwiched in between the first and second shield layers;
    a spin valve sensor formed between the first and the second gap layers;
    the spin valve sensor including:
        a free layer structure;
        an anti-parallel (AP) pinned layer structure formed over the first gap layer, the AP pinned layer structure including:
            a first AP pinned layer;
            a second AP pinned layer;
            an anti-parallel coupling (APC) layer formed between the first and the second AP pinned layers;
        a non-magnetic electrically conductive spacer layer formed between the free layer structure and the AP pinned layer structure;
        first and second antiferromagnetic (AFM) pinning layer structures formed over the first gap layer in end regions of the sensor but absent from a central region of the sensor;
        the first AP pinned layer being formed in the central region and over the first and the second AFM pinning layer structures in the end regions;
        first and second lead layers formed in the end regions; and
        the second gap layer being formed over the first and second lead layers in the end regions and over the sensor in the central region.

8. The magnetic head of claim 7, further comprising:
    first and second hard bias layers formed underneath the first and the second lead layers, respectively, in the end regions.

9. The magnetic head of claim 7, further comprising:
    first and second hard bias layers formed underneath the first and the second lead layers, respectively, in the end regions; and
    first and second insulator layers formed in between the first and the second hard bias layers and the first AP pinned layer in the end regions.

10. The magnetic head of claim 7, further comprising:
    wherein the first and second AFM pinning layer structures are formed adjacent to and in contact with the first AP pinned layer in the end regions; and
    wherein each one of the first and the second AFM pinning layer structures is separated a distance $D_A$ from edges of an active sensor region of the sensor.

11. The magnetic head of claim 7, further comprising:
    wherein portions of the first AP pinned layer are formed over and in contact with the first and second AFM pinning layer structures in the end regions.

12. A disk drive, comprising:
a housing;
a magnetic disk rotatably supported in the housing;
a magnetic head;
a support mounted in the housing for supporting the magnetic head so as to be in a transducing relationship with the magnetic disk;
a spindle motor for rotating the magnetic disk;
an actuator connected to the support for moving the magnetic head to multiple positions with respect to said magnetic disk;
a processor connected to the magnetic head, to the spindle motor, and to the actuator for exchanging signals with the magnetic head for controlling movement of the magnetic disk and for controlling the position of the magnetic head;
the magnetic head including first and second shield layers, first and second gap layers sandwiched in between the first and second shield layers, and a spin valve sensor formed between the first and the second gap layers, the spin valve sensor comprising:
  a free layer structure;
  an anti-parallel (AP) pinned layer structure formed over the first gap layer, the AP pinned layer structure including:
    a first AP pinned layer;
    a second AP pinned layer;
    an anti-parallel coupling (APC) layer formed between the first and the second AP pinned layers;
  a non-magnetic electrically conductive spacer layer formed between the free layer structure and the AP pinned layer structure;
  first and second antiferromagnetic (AFM) pinning layer structures formed over the first gap layer in end regions of the sensor but absent from a central region of the sensor;
  the first AP pinned layer being formed in the central region and over the first and the second AFM pinning layer structures in the end regions;
  first and second lead layers formed in the end regions; and
  the second gap layer being formed over the first and second lead layers in the end regions and over the sensor in the central region.

13. The disk drive head of claim 12, further comprising:
first and second hard bias layers formed underneath the first and the second lead layers, respectively, in the end regions.

14. The disk drive head of claim 12, further comprising:
wherein the first and second AFM pinning layer structures are formed adjacent to and in contact with the first AP pinned layer in the end regions.

15. The disk drive of claim 12, further comprising:
wherein the first and second AFM pinning layer structures are formed adjacent to and in contact with the first AP pinned layer in the end regions; and
wherein each one of the first and the second AFM pinning layer structures is separated a distance $D_A$ from edges of an active sensor region of the sensor.

16. The disk drive of claim 12, further comprising:
first and second hard bias layers formed underneath the first and the second lead layers, respectively, in the end regions; and
first and second insulator layers formed in between the first and the second hard bias layers and the first AP pinned layer in the end regions.

* * * * *